(12) United States Patent
Kuehner et al.

(10) Patent No.: US 7,459,954 B2
(45) Date of Patent: Dec. 2, 2008

(54) CONTROL CIRCUIT FOR CONTROLLING AN ELECTRONIC CIRCUIT AND METHOD FOR THIS

(75) Inventors: Jochen Kuehner, Backnang (DE); Robert Plikat, Ummern (DE); Stefan Mueller, Stuttgart (DE); Stephan Rees, Ludwigsburg (DE); Armin Ruf, Stuttgart (DE)

(73) Assignee: Robert Bosch GmbH, Stuttgart (DE)

( * ) Notice: Subject to any disclaimer, the term of this patent is extended or adjusted under 35 U.S.C. 154(b) by 0 days.

(21) Appl. No.: 10/593,516

(22) PCT Filed: Feb. 7, 2005

(86) PCT No.: PCT/EP2005/050511

§ 371 (c)(1),
(2), (4) Date: Jul. 10, 2007

(87) PCT Pub. No.: WO2005/091502

PCT Pub. Date: Sep. 29, 2005

(65) Prior Publication Data

US 2008/0001586 A1 Jan. 3, 2008

(30) Foreign Application Priority Data

Mar. 19, 2004 (DE) .................. 10 2004 013 599

(51) Int. Cl.
*H03K 17/04* (2006.01)
(52) U.S. Cl. .................. 327/374; 363/51; 361/91.1
(58) Field of Classification Search .................. 327/374; 363/51; 361/91.1
See application file for complete search history.

(56) References Cited

U.S. PATENT DOCUMENTS

| | | | | |
|---|---|---|---|---|
| 3,814,987 | A * | 6/1974 | Chacon | 361/18 |
| 4,208,691 | A * | 6/1980 | Rogowsky | 361/79 |
| 4,375,074 | A * | 2/1983 | Glogolja | 361/91.1 |
| 4,438,473 | A * | 3/1984 | Cawley et al. | 361/18 |
| 4,561,047 | A * | 12/1985 | DePuy | 363/56.1 |
| 4,730,244 | A * | 3/1988 | Zimmerman | 363/49 |
| 4,767,976 | A * | 8/1988 | Mutoh et al. | 318/808 |
| 4,894,762 | A * | 1/1990 | Steinshorn | 363/35 |
| 5,280,228 | A * | 1/1994 | Kanouda et al. | 318/803 |
| 5,369,308 | A * | 11/1994 | Schoofs et al. | 327/427 |
| 5,373,223 | A * | 12/1994 | Akagi et al. | 318/722 |
| 5,475,329 | A | 12/1995 | Jones et al. | |
| 5,767,545 | A * | 6/1998 | Takahashi | 257/341 |
| 5,828,141 | A | 10/1998 | Foerster et al. | |

(Continued)

FOREIGN PATENT DOCUMENTS

EP 0 851 516 7/1998

*Primary Examiner*—Kenneth B. Wells
(74) *Attorney, Agent, or Firm*—Kenyon & Kenyon LLP

(57) ABSTRACT

A control circuit for controlling an electronic circuit, which has a current path through a semiconductor switch and a line; when the semiconductor switch is switched, the inductance of the line and/or of a component in the current path producing an excess voltage between a first and a second current-carrying terminal of the semiconductor switch; the control circuit having a controllable current source for charging or discharging a charge-controlled gate of the semiconductor switch with the aid of a control current, as well as a control unit; the control unit controlling the current source in such a manner, that in the case of a switching operation, the terminal voltage across the current-carrying terminals of the semiconductor switch does not exceed a predefined setpoint terminal voltage.

15 Claims, 4 Drawing Sheets

U.S. PATENT DOCUMENTS

| | | | |
|---|---|---|---|
| 6,011,416 A * | 1/2000 | Mizuno et al. | 327/108 |
| 6,046,516 A | 4/2000 | Maier et al. | |
| 6,269,010 B1 * | 7/2001 | Ma et al. | 363/35 |
| 6,285,235 B1 | 9/2001 | Ichikawa et al. | |
| 6,545,513 B2 * | 4/2003 | Tsuchida et al. | 327/108 |
| 6,903,597 B2 * | 6/2005 | Tai | 327/434 |

* cited by examiner

CONTROL CIRCUIT FOR CONTROLLING AN ELECTRONIC CIRCUIT AND METHOD FOR THIS

FIELD OF THE INVENTION

The present invention relates to a control circuit for controlling an electronic circuit. The present invention also relates to a method for controlling an electronic circuit.

BACKGROUND INFORMATION

Voltage-controlled semiconductor switches, such as MOSFET's and IGBT's, are almost exclusively used in electronic actuators. Such electronic actuators are used, for example, as d.c. chopper controllers, pulse-controlled inverters, and the like. Such as circuit normally has a current path, which includes a load inductor, a free-wheeling diode, and a semiconductor switch, in particular in the form of a field-effect transistor. In addition, the line connections between the components have inherent inductances, which are parasitic and affect the switching performance in the current path.

In order to bring the field-effect transistor from a conducting state into a blocking state or from a blocking state into a conductive state, its gate-source capacitor must be discharged or charged. Therefore, a comparatively high recharging current (for instance, between 0.5 and 4 A) is necessary for a transition that is as rapid as possible (customary recharging times are only several hundred nanoseconds). These recharging currents are normally provided by a driver circuit. In particular, such a driver circuit has a voltage source, which charges or discharges the gate-source capacitor through a resistor, the resistor allowing the magnitude of the gate current to be changed and therefore allowing the switching rate of the power semiconductor to be controlled.

In addition, a diode circuit may be provided with a diode and a resistor, the diode being connected in parallel to the resistor, in order to allow the gate-source capacitor to discharge more rapidly during a circuit-breaking operation. The setting of the charging and discharging rates of the gate-source capacitor is important, since when the field-effect transistor is abruptly switched off due to the inductances in the current path, the voltage across the drain and source of the field-effect transistor increases beyond the provided supply voltage. Since the field-effect transistor only has a certain dielectric strength, by which a maximum drain-source voltage is predetermined, the rate of change of the charging or discharging current for the gate-source capacitor must be specified. A lower rate of change of the gate capacitor can reduce unwanted effects, such as the excess voltage between the drain and source terminals due to parasitic inductances, disruptive emissions, and reverse diode currents, but then the switching losses, i.e. the power in the field-effect transistor converted into heat, increase considerably. Fixing the charging or discharging rate of the gate-source capacitor only allows a compromise to be obtained between, on one hand, switching losses and, the other hand, excess voltages and disruptive emissions.

SUMMARY OF THE INVENTION

The object of the present invention is to provide a control circuit and a control method, which render possible improved switching performance of an electronic circuit.

According to a first aspect of the present invention, a control circuit is provided for controlling an electronic circuit, which has a current path through a semiconductor switch and through a line. When the semiconductor switch is switched, the inductance of the line and/or of a component in the current path leads to excess voltage between a first and a second current-carrying terminal of the semiconductor switch. The control circuit has a controllable current source for charging or discharging a charge-controlled gate of the semiconductor switch with the aid of a control current, as well as a control unit. The control unit controls the current source in such a manner, that in the case of the switching operation, the terminal voltage across the current-carrying terminals of the semiconductor switch does not exceed a predefined setpoint terminal voltage.

The idea of the present invention is to reduce and control the high excess voltages between the terminals of a semiconductor switch during the circuit-closing and circuit-breaking operations, the excess voltages being formed due to inductances in the current path to be switched. This is achieved by applying a controlled control voltage to the control terminal of the semiconductor switch, the control voltage being set as a function of the terminal voltage at the semiconductor switch. Since the semiconductor switch can normally only tolerate a maximum voltage between the current-carrying terminals, a setpoint terminal voltage is defined, the control voltage being controlled in such a manner, that the setpoint terminal voltage is not exceeded. This allows the commutation voltage to be directly specified, which means that on one hand, the dielectric strength of the utilized semiconductor switch may be utilized in an optimal manner and, on the other hand, the oscillations occurring during operation in response to the control according to the related art may be considerably reduced. During the control operation, the control keeps the semiconductor switch in its active operating range.

The control circuit of the present invention allows the excess voltages occurring between the current-carrying terminals of the semiconductor switch to be reduced and controlled without an additional protective circuit, and simultaneously keeps the increase in the switching losses as low as possible. The reduced excess voltage allows the disruptive electromagnetic emissions from the switching operation to be reduced, since the induced oscillation has a smaller starting amplitude and therefore decays more rapidly. This allows the filter and shielding measures to be designed to be less complicated and, therefore, more cost-effective.

In the case of power field-effect transistors, closing resistance $R_{DS,on}$ increases superproportionally to the maximum blocking voltage, but is inversely proportional to the chip area of the field-effect transistor. Limiting the excess voltage allows field-effect transistors having a lower breakdown voltage to be used. These have a lower closing resistance with the same chip area, which means that the efficiency of the power electronics may be increased. On the other hand, if field-effect transistors having a smaller chip area and the same closing resistance $R_{DS,on}$ as a larger field-effect transistor are used, a reduction in volume occurs.

The setpoint terminal voltage is preferably a function of the maximum allowable terminal voltage between the current-carrying terminals of the semiconductor switch. Therefore, the setpoint terminal voltage is selected to be greater than the supply voltage of the electronic circuit, but less than the maximum allowable terminal voltage by a specific, safe amount. In particular, a relative safety range regarding the maximum allowable terminal voltage may be defined.

The control unit may have a comparator circuit for comparing the terminal voltage to the setpoint terminal voltage and controlling the current source as a function of the comparison result.

The control unit may have a P controller, in order to control the current source so that a change in the control current is proportional to the difference between the terminal voltage and the setpoint terminal voltage. This represents the simplest possible implementation of a control unit according to the control circuit of the present invention.

In the case of a circuit-breaking operation, the setpoint terminal voltage may be greater than the operating voltage applied to the current path. In particular, the setpoint terminal voltage is selected to be greater than the operating voltage, but less than the maximum allowable terminal voltage of the semiconductor switch.

The current source may be designed such that the control input of the semiconductor switch may be charged by the current source to a potential, which is less than the lowest current-path potential predetermined by the operating voltage. In this manner, a negative gate-source voltage may be obtained, by which, in particular, the semiconductor switch may be completely blocked or completely switched through as a function of the conductivity type of the semiconductor switch.

In the case of a circuit-closing operation, the control unit preferably adjusts the setpoint terminal voltage to a first setpoint value initially, and then adjusts it to a second setpoint value after a period of time elapses, the second setpoint value being less than or equal to a low operating potential in the case of a self-blocking semiconductor switch, i.e., a semiconductor switch that is normally off, or greater than or equal to a high operating potential in the case of a self-conducting semiconductor switch, i.e., a semiconductor switch that is normally on. Such a two-stage switching operation is useful for being able to control the excess voltages during the circuit-closing operation in the most effective manner possible. To this end, in accordance with the first setpoint value, the semiconductor switch is preferably operated in its active operating range during the period of time. In order to limit the forward power losses in the semiconductor switch, the second setpoint value must be set as the setpoint terminal voltage after expiration of the period of time, in order to completely switch the semiconductor switch through, so that the semiconductor switch is not destroyed by the high forward power losses. If the second setpoint value were to be properly specified at the start of the circuit-closing operation, i.e. if the circuit-closing operation is only performed by specifying a setpoint terminal voltage, which is less than or equal to a low operating potential or greater than or equal to a high operating potential as a function of the conductivity type of the utilized semiconductor switch, the control unit would attempt to completely switch the semiconductor switch on as rapidly as possible. This would result in the commutation voltage at the inductors and, therefore, the rate of change of the current in the current path as well, becoming very large, which means that the switching operation would nearly correspond to a switching operation according to the related art and the voltage between the current-carrying terminals would sharply increase. The two-stage control operation allows the rate of change of the current in the current path to be reduced, so that disruptive emissions are reduced.

A delay element is preferably provided, in order to fix the period of time starting with the circuit-closing operation, the period of time at least corresponding to the time, after which the circuit-closing operation is always completed. This is necessary, in order to reliably prevent the controlling means from still attempting to completely switch on the semiconductor switch during the commutation operation.

As an alternative, a timing unit may be provided for setting the setpoint terminal voltage as a function of a current and/or voltage characteristic in the current path.

In the case in which a field-effect transistor is provided as a semiconductor switch, it is particularly possible for the period of time to be determined by the start of commutation and a maximum commutation duration after the start of the circuit-closing operation, the start of commutation being determined in that the increase in the gate-source voltage between the gate terminal and the source terminal becomes 0 for the first time after the start of the circuit-closing operation. In this specific embodiment, the fact that the derivative of the gate-source voltage approaches the value of 0 for the first time after the start of the circuit-closing operation when the commutation sets in, is utilized for detecting the start of commutation.

Alternatively, the start of commutation may be determined in that the drain-source voltage falls below a threshold potential, the threshold potential being between a maximum operating potential and the first setpoint voltage.

According to a further alternative, the start of commutation may be determined in that the control current falls below a threshold value for the first time after the start of the circuit-closing operation, the threshold value being between 0 V and a setpoint value for the control current.

According to further specific embodiment, the semiconductor switch may also take the form of an IGBT component.

According to a further aspect of the present invention, a method for controlling an electronic circuit is provided. The electronic circuit has a current path through a charge-controlled semiconductor switch and a line; when the semiconductor switch is switched, the inductance of the line and/or of the electrical components connected in the current path leads to an excess voltage between a first and a second current-carrying terminal of the semiconductor switch. A charge-controlled gate of the semiconductor switch is charged or discharged by a control current, the control current being controlled in such a manner that, in the case of a switching operation, the terminal voltage of the semiconductor switch does not exceed a predefined setpoint terminal voltage.

DETAILED DESCRIPTION

Figure 1:
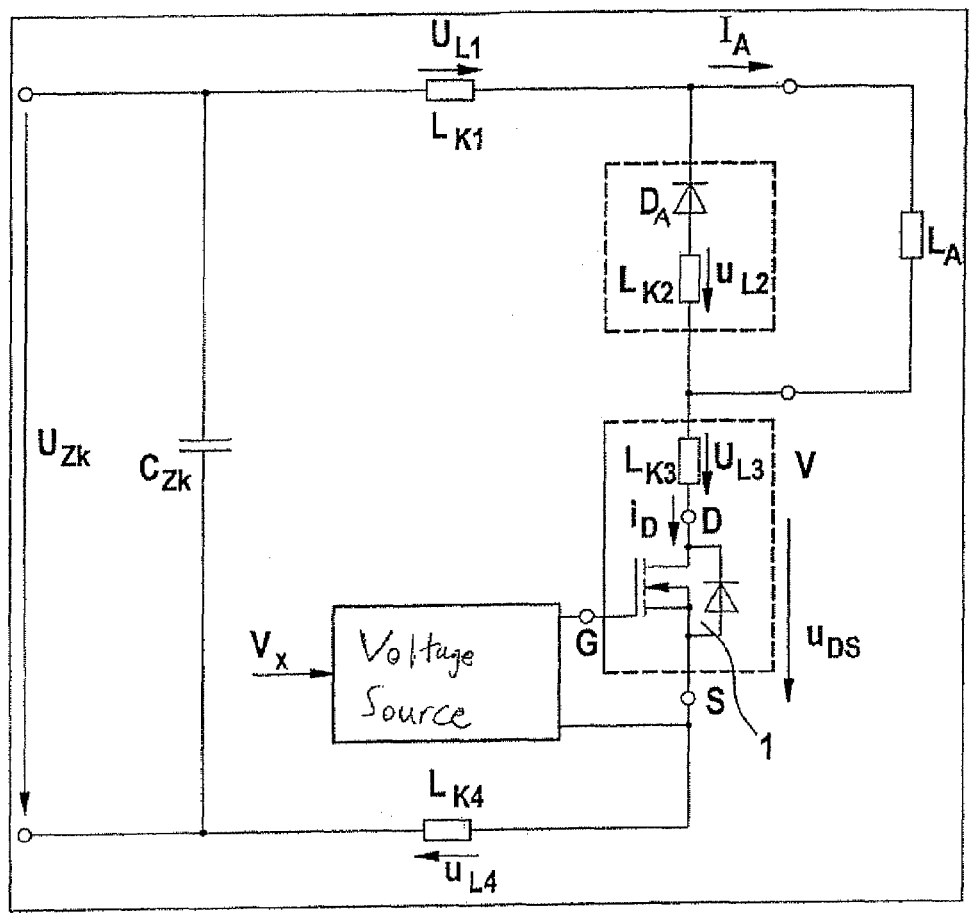
FIG. 1 shows a control circuit in an electronic circuit according to the related art.

Represented in FIG. 1 is an electronic actuator, which has a voltage-controlled semiconductor switch, in particular a MOSFET or an IGBT, and is used as a basic control circuit for different electronic circuits, such as a d.c. chopper controller, pulse-controlled inverter, etc. A current path, which is to be switched via a semiconductor switch 1 and has an inductive load $L_A$, is shown in FIG. 1. A free-wheeling diode $D_A$ is connected in parallel with inductive load $L_A$. In addition, the arrangement has an intermediate circuit capacitor $C_{Zk}$. The current-path leads between the components have parasitic line inductances $L_{K1}$, $L_{K2}$, $L_{K3}$, $L_{K4}$. A MOSFET may be used, for example, as a semiconductor switch. In the represented exemplary embodiment, the MOSFET is a self-blocking N-channel MOSFET 1. It is also possible to provide an IGBT or other semiconductor components as a semiconductor switch, in order to carry out the switching operation of the electronic actuator.

The present invention is described below on the basis of an electronic actuator having N-channel MOSFET transistor 1.

In order to carry out the switching operation with the aid of MOSFET 1, the MOSFET must be brought from the conductive state into the blocking state, and from the blocking state into the conductive state. To this end, its gate-source capacitor must be discharged or charged. Therefore, for a transition that is as rapid as possible, i.e. in the usual range of a few 100 ns, a comparatively large recharging current of, normally, 0.5 to 4 A is necessary. According to the related art, this recharging current is provided by special driver circuits.

Figure 2:
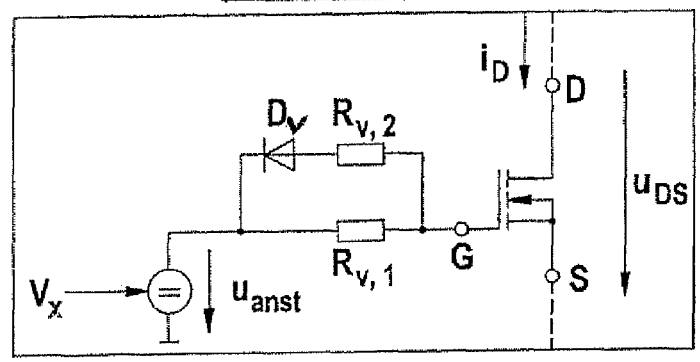
FIG. 2 shows a substitute circuit diagram of a simplified control circuit according to the related art.

FIG. 2 shows a simplified, substitute circuit diagram of such a driver circuit according to the related art, which has an ideal voltage source $U_{anst}$ and series gate resistors $R_{V,1}$, $R_{V,2}$. The MOSFET is switched on an off with the aid of a switching command $V_X$. The magnitude of the control current in the gate terminal may be changed, and therefore, the switching rate of the power semiconductor may be controlled, via the selection of series gate resistors $R_{V,1}$ and $R_{V,2}$. In addition, a diode circuit having a diode $D_V$ that is connected in series to second series gate resistor $R_{V,2}$ can ensure that the series gate resistor active during charging has a greater value than the one during the discharging of the gate-source capacitor. Due to the larger gate current, the circuit-breaking operation therefore proceeds more rapidly than the circuit-closing operation. The rate of the circuit-closing and circuit-breaking operations of the MOSFET may be set by suitably sizing voltage source $U_{anst}$ and series gate resistors $R_{V1}$, $R_{V,2}$. Thus, a lower rate of change of the drain current $di_D/dt$ through the MOSFET may be obtained, for example, by charging or discharging the gate-source capacitor more slowly, in order to thus reduce unwanted effects, such as a harmfully high, excess voltage between the drain terminal and source terminal due to parasitic inductances, disruptive emissions, and reverse diode currents.

On the other hand, the MOSFET is in an active operating state longer when the circuit-breaking and circuit-closing operations are slowed down, in which case a high switching power loss is generated in the MOSFET.

Figure 3:
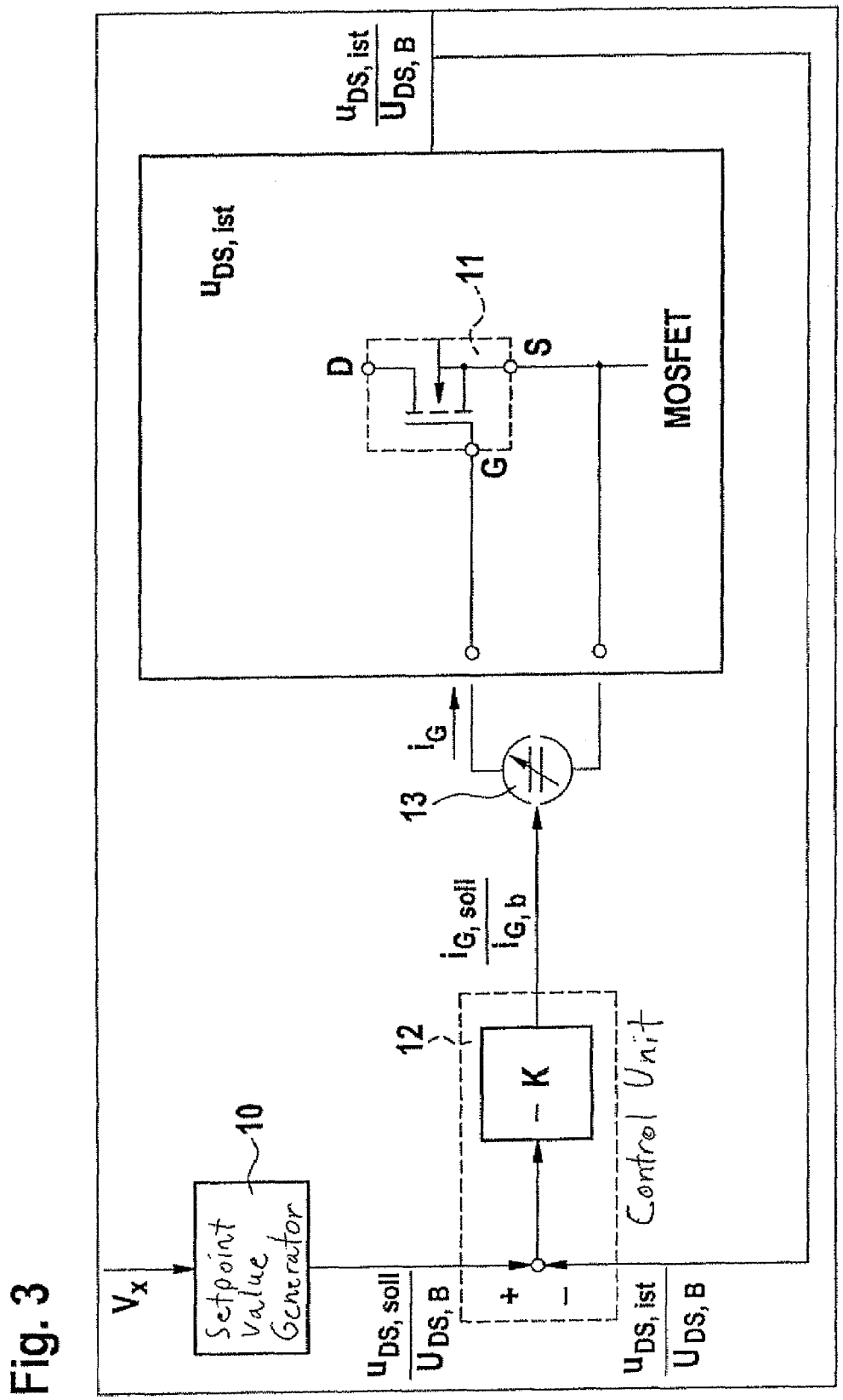
FIG. 3 shows a block diagram of a first specific embodiment of a control circuit according to the present invention.

FIG. 3 shows a block diagram of a control circuit according to the present invention. This circuit includes a setpoint value generator 10, which generates a desired setpoint terminal voltage for drain-source voltage $U_{DS}$ of MOSFET 11 from logical switching signal $V_X$, which specifies a switched-on state or switched-off state for the current path to be switched. In addition, a control unit 12 is provided which includes a proportional controller. Setpoint terminal voltage $U_{DS,setpoint}$ generated by setpoint-value generator 10 and current, actual terminal voltage $U_{DS,actual}$, that is, drain-source voltage $U_{DS}$, are supplied to control unit 12. The difference between these two variables represents the input variable for control device 12.

Control device 12 is connected to an output and a controllable current source 13, which is connected to the gate terminal of the MOSFET. The controlled current source sets a charging or discharging current for the gate-source capacitor of MOSFET 11 as a function of the triggering by control device 12. In the case of a proportional controller, the dependence between the input variable and the output variable is normally determined by a proportional relationship, e.g. by factor $-K$.

The gate current generated by controlled current source 13 then indirectly determines rate of change $di_D/dt$ of the drain current. If actual terminal voltage $U_{DS,actual}$ exceeds predefined setpoint terminal voltage $U_{DS,setpoint}$, control device 12 causes the gate current and, therefore, rate of change $di_D/dt$ of the drain current as well, to be reduced. However, this only occurs during the times of the switching operations, in which drain-source voltage $U_{DS}$ would increase without action of the controlling means via the predefined setpoint terminal voltage. During the remaining periods of time of the switching operations, control device 12 is switched such that it does not implement any unnecessary reduction in the gate current and, therefore, in rate of change $di_D/dt$ of the drain current. Consequently, the use of the control means only increases the switching losses to an extent necessary for reducing excess voltages or influencing the switching performance.

Such control allows a compromise to be obtained between, on one hand, the switching losses and, on the other hand, the excess voltages and disruptive emissions generated during the switching operations. Selection of setpoint terminal voltage $U_{DS,setpoint}$ particularly allows rate of change $di_D/dt$ to be selected to be so high, that the predefined limits for the excess voltages and disruptive emissions may be maintained.

During the switching operations in the electronic circuit, the control circuit of the present invention allows drain-source voltage $U_{DS}$ of the MOSFET to be limited and the commutation voltage to be directly specified. Consequently, the dielectric strength of the deployed power MOSFET's may be utilized in an optimum manner, and the oscillations occurring during operation in the case of a non-controlled drive circuit, as well as the associated disruptive emissions, may be reduced considerably. This results from the fact that limiting the excess voltage causes the induced oscillation to have a smaller starting amplitude and, therefore, to decay more rapidly. This leads to reduced disruptive electromagnetic emissions, which means that filtering and shielding measures may be implemented in a less complicated and, therefore, more cost-effective manner.

In addition, when power MOSFET's are used, closing resistance $R_{DS,on}$ increases superproportionally to the maximum blocking voltage and is inversely proportional to the chip area of the MOSFET. Limiting the excess voltage allows MOSFET's having a lower breakdown voltage to be used. These have a lower closing resistance $R_{DS,on}$ with the same chip area, which means that the efficiency of the power electronics may be increased. If, on the other hand, MOSFET's having a smaller size are used, which nevertheless have the same closing resistance as a larger MOSFET, costs and volume are reduced.

Rate of change $di_D/dt$ of the drain current during a switching operation is derived with intermediate-circuit voltage $U_{Zk}$ from the following equation:

$$\frac{di_D}{dt} = \frac{U_{Zk} - u_{DS}}{\sum_V L_{KV}}.$$

Since magnitude $L_{KV}$ of all parasitic inductances present in the current path is not exactly known, rate of change of drain current $di_D/dt$ may not be directly specified by the controlling means of the control circuit according to the present invention, since the controlling means adjusts the actual terminal voltage to a predefined setpoint terminal voltage.

Different values of setpoint terminal voltage $U_{DS,setpoint}$ must be specified as a function of the switching operation. A negative rate of change $di_D/dt$ of the drain current is produced in a circuit-breaking operation, the drain current being reduced down to 0 A. In order to be able to set this negative rate of change of the current, voltage difference $U_{Zk}$–$U_{DS}$ must also be negative. Therefore, during a breaking operation, setpoint terminal voltage $U_{DS,setpoint}$ must be specified for the drain/source voltage, which is greater than intermediate-circuit voltage $U_{Zk}$.

The greater the setpoint terminal voltage $U_{DS,setpoint}$, the greater the voltage drop at the parasitic inductors during the switching operation and, therefore, the greater the rate of change $di_D/dt$ of the drain current.

Figure 4:
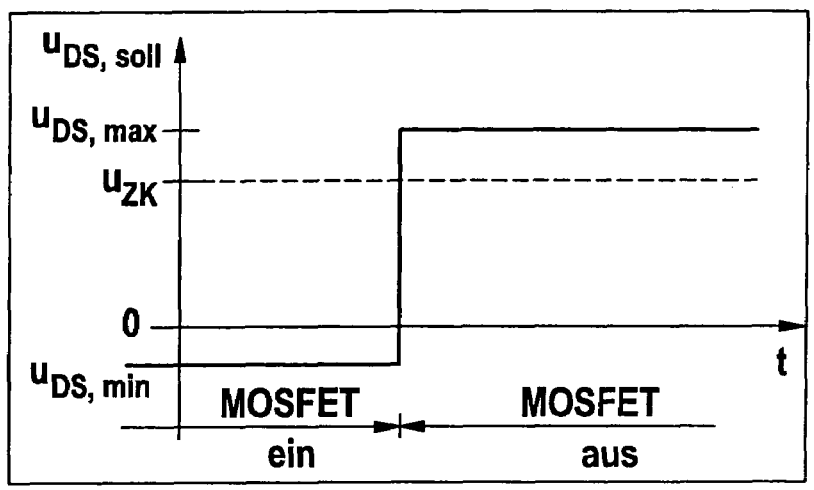
FIG. 4 shows a diagram for representing the characteristic of the setpoint terminal voltage during a circuit-breaking operation.

The resulting curve of predefined setpoint terminal voltage $U_{DS,setpoint}$ is plotted in FIG. 4. It can be seen that a constant setpoint terminal voltage of less than 0 is specified in the closed-circuit state of MOSFET 11. This ensures that the gate-source capacitor is charged to the maximum possible voltage and MOSFET 11 is completely switched on. The maximum possible voltage results from the design of the controlled current source and, as a rule, is approximately equivalent to the positive supply voltage of controlled current source 13.

If the MOSFET is switched off in accordance with a switching signal $V_x$ provided at an input of setpoint-value generator 10, a value specified in accordance with the power-handling capacity of MOSFET 11 is selected as a value for the setpoint terminal voltage. Setpoint terminal voltage $U_{DS,setpoint}$ should be selected to be less than the breakdown voltage of MOSFET 11, in order to prevent MOSFET 11 from being destroyed by a voltage breakover. Control device 12 then specifies gate current $i_G$ so that terminal voltage $U_{DS}$ at MOSFET 11 reaches the setpoint terminal voltage but essentially does not exceed it. The voltage falling at aggregate commutation inductance $L_K$ during the circuit-breaking operation is therefore set by the control device to setpoint terminal voltage $U_{Zk}$–$U_{DS,max}$. Rate of change $di_D/dt$ of the drain current results from this in accordance with the above-mentioned equation.

As soon as the diode current through freewheeling diode $D_A$ has reached its final value $I_A$ and drain current $i_D$ has reached a value of 0, and the commutation has therefore ended, there is no longer any significant voltage drop at inductors $L_{K1}$ through $L_{K4}$, $L_A$. In the open-circuit state, the terminal voltage across MOSFET 11 then corresponds to intermediate-circuit voltage $U_{Zk}$. However, control device 12 continues to attempt to keep terminal voltage $U_{DS}$ at the specified setpoint value of $U_{DS,max}$ and therefore sets a negative gate current $i_G$, which means that the gate-source capacitor is further discharged. Therefore, by maintaining the application of setpoint terminal voltage $U_{DS,setpoint}$ after the end of the commutation, the control device discharges the gate-source capacitor down to the minimum voltage predetermined by the negative supply voltage of controlled current source 13. Thus, it is ensured that MOSFET 11 does not become unintentionally conductive due to interference-induced voltages in the control circuit.

Figure 5:
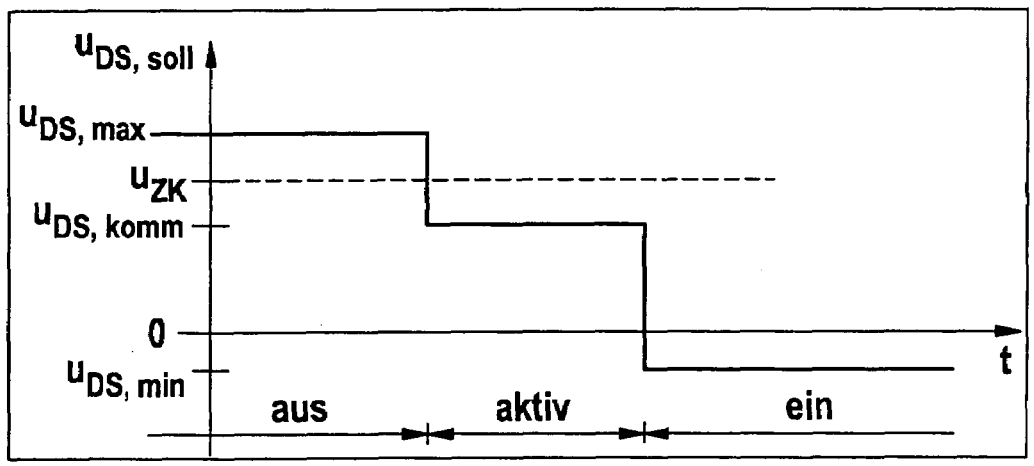
FIG. 5 shows a representation of the curve of the setpoint terminal voltage during a circuit-closing operation.

In accordance with the procedure in the circuit-breaking operation, the commutation voltage at the parasitic inductors is also specified in the circuit-closing operation, by selecting a suitable setpoint value for setpoint terminal voltage $U_{DS,setpoint}$. FIG. 5 shows the curve of setpoint value $U_{DS,setpoint}$ in a circuit-closing operation according to a preferred specific embodiment of the present invention.

During the circuit-closing operation, a positive rate of change $di_D/dt$ of the drain current is produced, which increases from 0 to $I_A$. In order to be able to build up the drain current, the voltage difference between intermediate-circuit voltage $U_{Zk}$ and terminal voltage $U_{DS}$ of MOSFET 11 must be positive. Therefore, a setpoint value $U_{DS,comm}$ less than intermediate-circuit voltage $U_{Zk}$ is required during a circuit-closing operation. Thus, a first setpoint value $U_{DS,comm}$, the commutation voltage, at which MOSFET 11 operates in an active operating range, is initially specified for switching on MOSFET 11. As soon as control device 12 has set terminal voltage $U_{DS}$ to this value, the voltage difference between intermediate-circuit voltage $U_{Zk}$ and commutation voltage $U_{DS,comm}$ decreases at the parasitic inductors, through which rate of change $di_D/dt$ of the drain current is determined.

After completion of the commutation operation, MOSFET 11 must be completely switched on as rapidly as possible, by specifying setpoint terminal voltage $U_{DS,min}$ to be less than or equal to 0. This is necessary, since during the commutation operation, the MOSFET operates in the active operating range, in which very high forward power losses are produced in the MOSFET that can already lead to its destruction after a short time. Therefore, after completion of the commutation operation, control device 12 adjusts setpoint terminal voltage $U_{DS,setpoint}$ to minimum value of terminal voltage $U_{DS,min}$. It is true that the control unit is not able to set negative setpoint terminal voltages $U_{DS,setpoint}$, but this consequently ensures that the gate-source capacitor is charged to the maximum possible voltage, which corresponds to the positive supply voltage of controlled current source 13, and MOSFET 11 is therefore completely switched on.

If the setpoint terminal voltage were to be set directly to minimum terminal voltage $U_{DS,min}$ at the beginning of the circuit-closing operation, and the period of time in which MOSFET 11 is operated in the active operating range were to be left out, control device 12 would attempt to completely switch on MOSFET 11 as rapidly as possible. This would result in commutation voltage $U_{Zk}$–$U_{DS}$ at the inductors, and therefore rate of change $di_D/dt$ of the drain current as well, becoming very large, which means that the switching operation would be nearly equivalent to the one in the case of the control according to the related art. In this case, a reduction in the disruptive emissions would not be attainable.

In order to carry out the circuit-closing operation in two stages, control device 12 is connected to setpoint-value generator 10, so that control device 12 is able to specify the time of the change from the selection of the first setpoint value to the selection of the second setpoint value. The falling edge of switching command $V_x$ of the superimposed control activates the adjustment of setpoint terminal voltage $U_{D,setpoint}$ to commutation voltage $U_{DS,comm}$. Switching command $V_x$ indicates that the current path should be switched on or switched off. The time, at which the setpoint terminal voltage is adjusted to minimum terminal voltage $U_{DS,min}$, is specified by a further switching signal $V_x'$ that is generated in setpoint-value generator 10.

Further switching signal $V_x'$ may first of all be generated from switching signal $V_x$ in a time-delayed manner, in that the period of time is selected to be so large, that the circuit-closing operation is definitely completed after it has elapsed. This is necessary, in order to reliably prevent the controlling means of terminal voltage $U_{DS}$ from still attempting to completely switch on MOSFET 11 during the commutation operation. As an alternative, switching signal $V_x'$ may be derived from signals that are already available in the control circuit. Terminal voltage $U_{DS}$, gate-source voltage $U_{GS}$, or gate-current setpoint value $i_{Gsetpoint}$ are suitable for this.

Further switching signal $V_x'$ may be generated from switching signal $V_x$ in a time-delayed manner, using, for example, a RC element and a subsequent Schmitt trigger or the like. The disadvantage of this is that the delay time must be at least as large as the longest occurring commutation period. In switching operations having shorter commutation times, unnecessarily high circuit-closing losses then occur, since the MOSFET is kept in the active state longer than necessary. In the ideal case, switching signal $V_x'$ would have to precisely signal the end of the commutation operation. However, the end of the commutation operation cannot be ascertained from the signal patterns in the current path or in the control loop.

Only the beginning of the commutation may be ascertained sufficiently accurately from the available signal patterns. Therefore, after the start of the commutation, the maximum time required for commutation must also elapse in the case of the second variant, in order to ensure that the MOSFET is only completely switched on when the commutation is definitely ended.

Although only the beginning of the commutation may be detected, and although because of the delay time fixed there the circuit-closing losses are increased beyond the end of the commutation due to the operation of MOSFET 11 in the active operating range, the determination of the start of commutation allows, however, the time of the switching operation of the setpoint terminal voltage of commutation voltage $U_{DS,comm}$ to more effectively approximate the end of the commutation for minimum voltage $U_{DS,min}$ for each operating range. Variable parameters, such as the charging time, which is needed for charging up the discharged gate-source capacitor up to the threshold voltage of MOSFET 11 and is a function of both the chip temperature and the gate-source capacitor, do not have to be considered when establishing the period of time up to applying the second setpoint value. These functional relationships must be considered in the time-delayed generation of switching signal $V_x'$ during the determination of the delay time with their respective maximum values, in order that it may be ensured that MOSFET 11 is only completely switched on when the commutation is ended. If, however, the start of the commutation is used as a basis for generating further switching signal $V_x'$, then the charging time of the gate-source capacitor does not have to be considered. Therefore, the delay time set in this manner corresponds to the actual commutation time considerably more precisely, which means that unnecessarily high circuit-closing losses are prevented.

Figure 6:
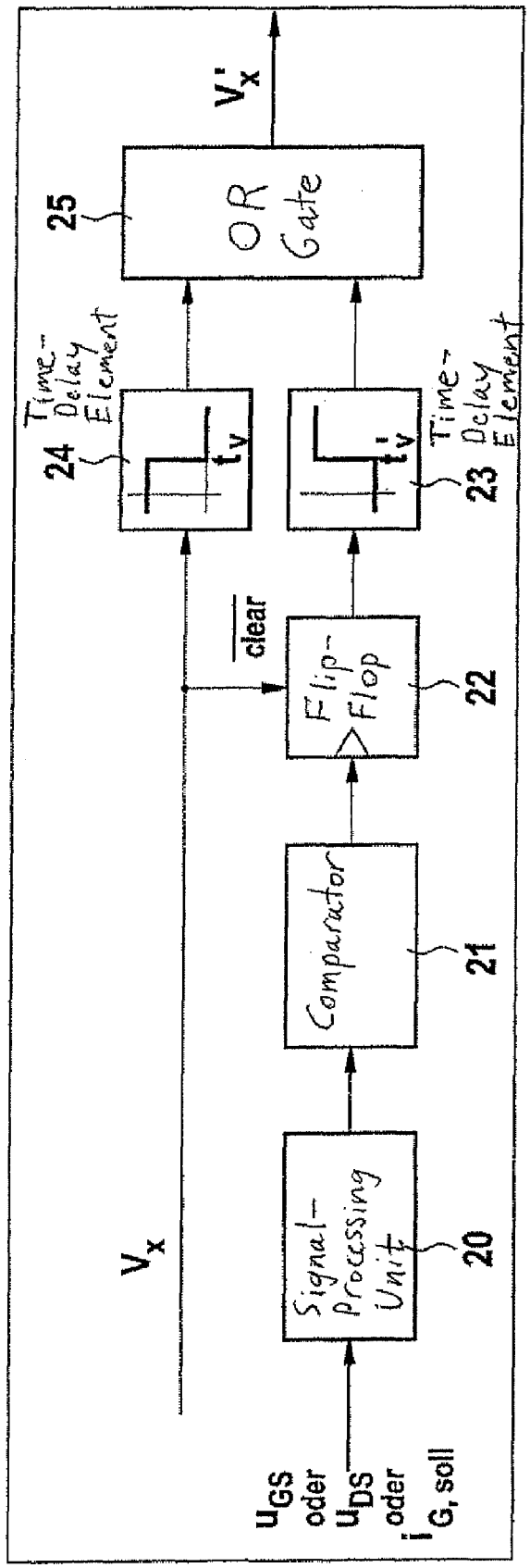
FIG. 6 shows a block diagram for generating a switching signal for determining the period of time for switching over between the first setpoint value and the second setpoint value in the case of a circuit-closing operation.

Shown in FIG. 6 is a block diagram of the circuit for generating further switching signal $V_x'$ from one of the electrical variables present in the current path or the control circuit. It is possible to generate switching signal $V_x'$ from gate-source voltage $U_{GS}$, drain-source voltage $U_{DS}$, or gate-current setpoint value $i_{G,setpoint}$. The electrical variable used for determining the start of commutation is first processed in a signal-processing unit 20, i.e. amplified, differentiated, filtered, or the like, and subsequently supplied to a comparator 21, whose switching threshold is set in such a manner, that it switches over as soon as the start of commutation is detectable in the input signal. This switching threshold is a function of the utilized electrical variable. Subsequent flip-flop 22 is set with the rising edge of the output signal of comparator 21, the rising edge indicating the beginning of commutation. Depending on the utilized electrical variable, an output comparator 21 assumes the high level for only a short time, which means that storage of the occurring result with the aid of flip-flop 22 is necessary. The output signal of flip-flop 22, which is delayed a period of time by time-delay element 23, is, in principle, already the desired switching signal $V_x'$. Since switching signal $V_x$ changes over to a low state when a circuit-breaking command is applied, switching signal $V_x'$ must assume the low state as well. To this end, the resetting input of flip-flop 22 is connected to switching signal $V_x$. Consequently, flip-flop 22 is reset as soon as switching signal $V_x$ changes over to a low state.

Due to a possible malfunction of the circuit for detecting the start of commutation, it is conceivable that switching signal $V_x'$ was not generated or not generated in time, and that MOSFET 11 is therefore not completely switched on. It would then continue to be operated in the active operating range, and the forward power losses then occurring would subsequently lead to its destruction. For this reason, the circuit is initially provided with a pure timing control system, which is formed by further delay element 24. The output signals at the outputs of the two delay elements 23, 24 are combined by an OR gate 25. As soon as the lower signal path, which goes through delay element 23 and is for the detection of the start of commutation, breaks down, the additional timing control unit ensures that MOSFET 11 is completely switched on after the period of time has elapsed.

It is possible to use the curve of gate-source voltage $U_{GS}$ for detecting the start of commutation. In this context, use is made of the fact that the derivative of the gate-source voltage approaches the value of zero for the first time after the occurrence of switching command $V_x$, when commutation sets in. The derivative of the gate-source voltage may be calculated by a differentiator, it being useful to connect a low-pass filter to the differentiator in outgoing circuit, in order to filter out high-frequency noise signals.

After the occurrence of switching command $V_x$, setpoint-value generator 10 adjusts setpoint terminal voltage $U_{DS,setpoint}$ to commutation voltage $U_{DS,com}$, in order to initiate a fall in drain-source voltage $U_{DS}$. As soon as drain-source voltage $U_{DS}$ has fallen below intermediate-circuit voltage $U_{Zk}$, a positive voltage decreases at the parasitic inductors and the commutation operation begins. The start of commutation may now be determined on the basis of the curve of the drain-source voltage. For this reason, a comparator is provided which detects when drain-source voltage $U_{DS}$ falls below a threshold voltage for the first time after the occurrence of switching command $V_x$, the threshold voltage having to be between setpoint terminal voltage $U_{DS,setpoint}$ adjusted to commutation voltage $U_{DS,comm}$, and intermediate-circuit voltage $U_{Zk}$.

It can also be provided that the start of commutation be determined on the basis of the curve of gate-current setpoint value $i_{G,setpoint}$. In this context, one makes use of the fact that after the occurrence of the circuit-closing command, drain-source voltage $U_{DS}$ decreases to setpoint terminal voltage $U_{DS,setpoint}$ adjusted with the aid of commutation voltage $U_{DS,comm}$. In the meantime, the magnitude of the system deviation decreases from $U_{DS,comm} - U_{Zk}$ to 0 V, when $U_{DS}$ has reached the adjusted setpoint value, which means that the proportional controller continuously reduces the gate-current setpoint value down to 0. With the aid of comparator 21, the time at which the gate-current setpoint value falls below a threshold voltage for the first time after the occurrence of switching command $V_x$ is now detected, the threshold value having to be greater than 0 and less than gate-current setpoint value $i_{G,setpoint}$, which is output by control device 12 immediately after the occurrence of switching command $V_x$.

What is claimed is:

1. A control circuit for controlling an electronic circuit, comprising:
   a semiconductor switch;
   a current path through the semiconductor switch and a line, wherein when the semiconductor switch is switched, an inductance of at least one of the line and a component in the current path produces an excess voltage between a first current-carrying terminal and a second current-carrying terminal of the semiconductor switch;
   a controllable current source for one of charging and discharging a charge-controlled gate of the semiconductor switch with the aid of a control current; and
   a control unit controlling the current source in such a manner, that in the case of a switching operation, a terminal voltage across the first current-carrying terminal and the second current-carrying terminal does not exceed a predefined setpoint terminal voltage;
   wherein in a circuit-closing operation, the control unit initially adjusts the setpoint terminal voltage to a first setpoint value, and then to a second setpoint value after expiration of a period of time, the second setpoint value being less than or equal to a low operating potential in the case of a self-blocking semiconductor switch, or greater than or equal to a high operating potential in the case of a self-conducting semiconductor switch.

2. The control circuit as recited in claim 1, wherein the setpoint terminal voltage is a function of a maximum permissible terminal voltage between the first current-carrying terminal and the second current-carrying terminal.

3. The control circuit as recited in claim 1, further comprising:
   a comparator circuit for comparing the terminal voltage to the setpoint terminal voltage and controlling the current source as a function of a comparison result.

4. The control circuit as recited in claim 3, wherein the control unit includes a P controller for controlling the current source in such a manner, that a change in the control current is proportional to a difference between the terminal voltage and the setpoint terminal voltage.

5. The control circuit as recited in claim 1, wherein in one of a circuit-breaking operation and a circuit-closing operation, the terminal voltage is greater than an operating voltage applied to the current path.

6. The control circuit as recited in claim 5, wherein a control input of the semiconductor switch is chargeable via the current source to a potential that is lower than a lowest potential of the current path.

7. The control circuit as recited in claim 1, wherein the first setpoint value is selected so that the semiconductor switch operates in an active operating range.

8. The control circuit as recited in claim 7, further comprising:
   a delay element in order to fix a period of time starting with a circuit-closing operation, the period of time at least corresponding to a time after which the circuit-closing operation is definitely ended.

9. The control circuit as recited in claim 8, further comprising:
   a timing unit for selling the setpoint terminal voltage as a function of at least one of a current characteristic and a voltage characteristic in the current path.

10. The control circuit as recited in claim 9, wherein the semiconductor switch includes a field-effect transistor, the terminal voltage representing a drain-source voltage between a drain terminal and a source terminal, and a control input representing the gate terminal.

11. The control circuit as recited in claim 10, wherein the period of time is determined by the start of a commutation and a maximum commutation period after a start of the circuit-closing operation, the start of commutation being determined in that the increase in the gate-source voltage between the gate terminal and source terminal is 0 for the first time after the start of the circuit-closing operation.

12. The control circuit as recited in claim 10, wherein the period of time is determined by the start of a commutation and a maximum commutation period after the start of the circuit-closing operation, the start of commutation being determined in that the drain-source voltage falls below a threshold potential, the threshold potential being between a maximum operating potential and the first setpoint voltage.

13. The control circuit as recited in claim 10, wherein the period of time is determined by the start of a commutation and a maximum commutation period after the start of the circuit-closing operation, the start of commutation being determined in that the control current falls below a threshold value for the first time after the start of the circuit-closing operation, the threshold value being between 0 V and a control-current setpoint value.

14. The control circuit as recited in claim 1, wherein the semiconductor switch includes an IGBT component.

15. A method for controlling an electronic circuit, which has a current path through a semiconductor switch and a line, comprising:
   switching the semiconductor switch, an inductance of the line producing an excess voltage between a first and a second current-carrying terminal of the semiconductor switch; and
   one of charging and discharging a gate of the semiconductor switch with the aid of a control current, the control current being controlled in such a manner that, in the case of a switching operation, the terminal voltage of the semiconductor switch does not exceed a predefined setpoint terminal voltage;
   wherein in a circuit-closing operation, a control unit initially adjusts the setpoint terminal voltage to a first setpoint value and then to a second setpoint value after expiration of a period of time, the second setpoint value being less than or equal to a low operating potential in the case of a self-blocking semiconductor switch, or greater than or equal to a high operating potential in the case of a self-conducting semiconductor switch.

* * * * *